(12) United States Patent
Hartner et al.

(10) Patent No.: US 11,251,146 B2
(45) Date of Patent: Feb. 15, 2022

(54) SEMICONDUCTOR DEVICES HAVING A NON-GALVANIC CONNECTION

(71) Applicant: Infineon Technologies AG, Neubiberg (DE)

(72) Inventors: Walter Hartner, Bad Abbach-Peissing (DE); Francesca Arcioni, Munich (DE); Birgit Hebler, Aue (DE); Martin Richard Niessner, Munich (DE); Claus Waechter, Sinzing (DE); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 130 days.

(21) Appl. No.: 16/841,298

(22) Filed: Apr. 6, 2020

(65) Prior Publication Data
US 2020/0321295 A1 Oct. 8, 2020

(30) Foreign Application Priority Data
Apr. 8, 2019 (DE) .......................... 102019109200.0

(51) Int. Cl.
*H01L 21/00* (2006.01)
*H01L 23/00* (2006.01)
*H01L 23/522* (2006.01)

(52) U.S. Cl.
CPC .......... *H01L 24/05* (2013.01); *H01L 23/5223* (2013.01); *H01L 23/5227* (2013.01); *H01L 24/13* (2013.01); *H01L 2224/0233* (2013.01); *H01L 2224/02375* (2013.01); *H01L 2224/02379* (2013.01); *H01L 2224/02381* (2013.01); *H01L 2224/0401* (2013.01); *H01L 2224/0557* (2013.01); *H01L 2224/05556* (2013.01); *H01L 2224/05569* (2013.01); *H01L 2224/13024* (2013.01)

(58) Field of Classification Search
CPC .. H01L 24/05; H01L 23/5223; H01L 23/5227
See application file for complete search history.

(56) References Cited

U.S. PATENT DOCUMENTS

| 8,026,593 | B2 * | 9/2011 | Lin | .......................... | H01L 24/05 257/700 |
| 8,113,436 | B2 * | 2/2012 | Wang | ....................... | H01Q 9/28 235/492 |
| 8,389,396 | B2 * | 3/2013 | Lin | .......................... | H01L 24/17 438/612 |

(Continued)

FOREIGN PATENT DOCUMENTS

| CN | 111799247 A | * | 10/2020 | ......... | H01L 23/5223 |
| DE | 102019109200 A1 | * | 10/2020 | ............. | H01L 24/13 |

(Continued)

*Primary Examiner* — Laura M Menz
(74) *Attorney, Agent, or Firm* — Harrity & Harrity, LLP

(57) ABSTRACT

A semiconductor device comprises a semiconductor chip having a radio-frequency circuit and a radio-frequency terminal, an external radio-frequency terminal, and a non-galvanic connection arranged between the radio-frequency terminal of the semiconductor chip and the external radio-frequency terminal, wherein the non-galvanic connection is designed to transmit a radio-frequency signal.

20 Claims, 8 Drawing Sheets

(56) References Cited

U.S. PATENT DOCUMENTS

| | | | | |
|---|---|---|---|---|
| 8,389,406 B2* | 3/2013 | Sameshima | ....... | H01L 21/76877 438/675 |
| 9,444,262 B2* | 9/2016 | Saumer | ..................... | H02J 4/00 |
| 2003/0062541 A1* | 4/2003 | Warner | ................... | G06F 21/10 257/200 |
| 2003/0230798 A1* | 12/2003 | Lin | ......................... | H01L 24/11 257/704 |
| 2008/0237880 A1* | 10/2008 | Lin | .................... | H01L 23/5228 257/774 |
| 2009/0212879 A1* | 8/2009 | Rofougaran | ............ | H01L 23/66 333/25 |
| 2010/0038763 A1* | 2/2010 | Wang | ..................... | H01L 24/32 257/679 |
| 2011/0170231 A1* | 7/2011 | Chandrasekaran | ..... | H01L 23/66 361/306.1 |
| 2012/0003830 A1* | 1/2012 | Lin | ......................... | H01L 24/06 438/637 |
| 2013/0075906 A1* | 3/2013 | Matsuda | ................. | H01L 24/03 257/738 |
| 2013/0100570 A1* | 4/2013 | Lyngby | ................... | F03D 80/30 361/117 |
| 2013/0307661 A1* | 11/2013 | Winheim | ............. | H01H 37/761 337/401 |
| 2014/0097679 A1* | 4/2014 | Saumer | ..................... | H02J 4/00 307/18 |
| 2015/0061091 A1* | 3/2015 | Seler | ....................... | H01L 24/19 257/664 |
| 2016/0209457 A1* | 7/2016 | Lehmann | ................ | G01D 18/00 |
| 2016/0358871 A1* | 12/2016 | Yen | ......................... | H01L 24/11 |
| 2017/0084591 A1* | 3/2017 | Magnus | ........... | H01L 23/49838 |
| 2019/0334340 A1* | 10/2019 | Niehoff | ................ | H01H 33/596 |
| 2020/0112065 A1* | 4/2020 | Eliassen | ............ | H02J 7/00718 |
| 2020/0321295 A1* | 10/2020 | Hartner | ............... | H01L 23/5222 |
| 2020/0388583 A1* | 12/2020 | Theuss | ............... | H01L 23/5227 |
| 2021/0210462 A1* | 7/2021 | Sridharan | ............. | H01L 23/522 |

FOREIGN PATENT DOCUMENTS

| | | |
|---|---|---|
| EP | 1 369 917 A2 | 12/2003 |
| JP | 2018125473 A | 8/2018 |

* cited by examiner

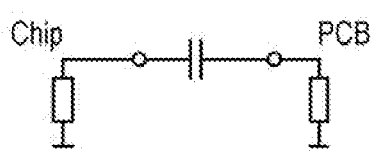 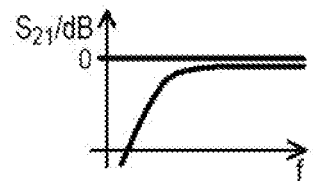
Fig. 15
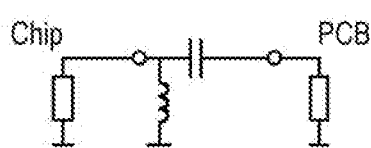 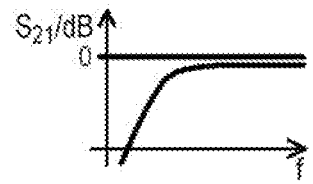
Fig. 16
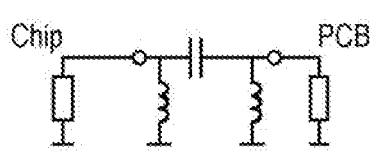 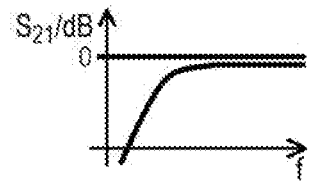
Fig. 17
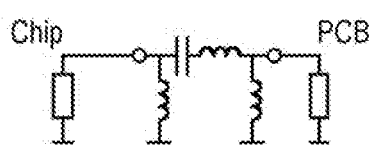 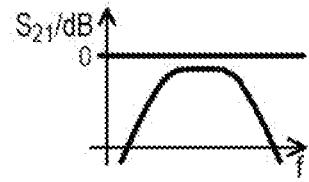
Fig. 18
Forming a non-galvanic connection between an RF terminal of a semiconductor chip and an external RF terminal of a semiconductor device — 40
Fig. 19

SEMICONDUCTOR DEVICES HAVING A NON-GALVANIC CONNECTION

CROSS REFERENCE TO RELATED APPLICATION

This application claims priority to German Patent Application No. 102019109200.0 filed on Apr. 8, 2019, the content of which is incorporated by reference herein in its entirety.

TECHNICAL FIELD

The present disclosure relates generally to semiconductor technology. For example, the disclosure relates to semiconductor devices having a non-galvanic connection and methods for producing such semiconductor devices.

BACKGROUND

In semiconductor devices, electrical connections for transmitting radio-frequency signals are usually realized by metallic signal lines. By way of example, radio-frequency signals can be passed from a semiconductor chip of the device through the device housing to an application circuit board.

BRIEF SUMMARY

Various aspects relate to a semiconductor device. The semiconductor device comprises a semiconductor chip having a radio-frequency circuit and a radio-frequency terminal. The semiconductor device furthermore comprises an external radio-frequency terminal. The semiconductor device furthermore comprises a non-galvanic connection arranged between the radio-frequency terminal of the semiconductor chip and the external radio-frequency terminal, wherein the non-galvanic connection is designed to transmit a radio-frequency signal.

Various aspects relate to a method for producing a semiconductor device. The method comprises forming a non-galvanic connection between a radio-frequency terminal of a semiconductor chip of the semiconductor device and an external radio-frequency terminal of the semiconductor device, wherein the non-galvanic connection is designed to transmit a radio-frequency signal.

BRIEF DESCRIPTION OF THE DRAWINGS

Semiconductor devices having a non-galvanic connection and associated production methods in accordance with the disclosure are explained in greater detail below with reference to drawings. The elements shown in the drawings are not necessarily rendered in a manner true to scale relative to one another. Identical reference signs may denote identical components.

FIG. 15 shows a circuit having an electrical capacitance formed by a non-galvanic connection. Furthermore, FIG. 15 shows a filter characteristic of the circuit.

FIG. 16 shows a circuit having an electrical capacitance formed by a non-galvanic connection and one inductor. Furthermore, FIG. 16 shows a filter characteristic of the circuit.

FIG. 17 shows a circuit having an electrical capacitance formed by a non-galvanic connection and two inductors. Furthermore, FIG. 17 shows a filter characteristic of the circuit.

FIG. 18 shows a circuit having an electrical capacitance formed by a non-galvanic connection and three inductors. Furthermore, FIG. 18 shows a filter characteristic of the circuit.

FIG. 19 illustrates a flow diagram of a method for producing a semiconductor device in accordance with the disclosure.

DETAILED DESCRIPTION

In the following detailed description, reference is made to the accompanying drawings, which show for illustration purposes concrete aspects and implementations in which the disclosure can be implemented in practice. In this context, direction terms such as, for example, "at the top", "at the bottom", "at the front", "at the back", etc. may be used with respect to the orientation of the figures described. Since the components of the implementations described can be positioned in different orientations, the direction terms may be used for illustration purposes and are not restrictive in any way whatsoever. Other aspects can be used and structural or logical changes can be made, without departing from the concept of the present disclosure. That is to say that the following detailed description should not be understood in a restrictive sense.

Schematic views of semiconductor devices in accordance with the disclosure are described below. The semiconductor devices are illustrated here in a general way in order to describe aspects of the disclosure qualitatively. The semiconductor devices can each have further aspects, which are not illustrated in the figures for the sake of simplicity. For example, the respective semiconductor devices can be extended by any desired aspects described in connection with other devices in accordance with the disclosure.

Figure 1:
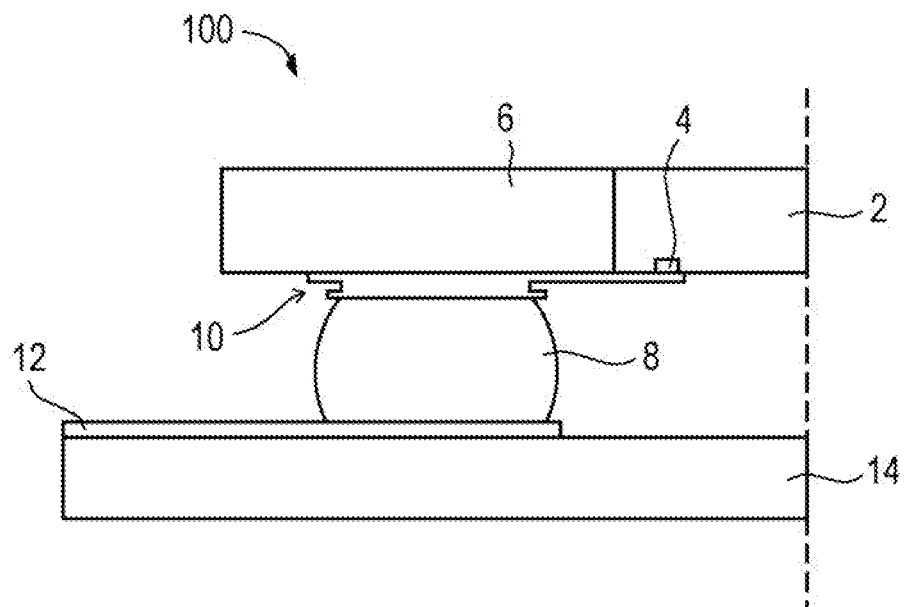
FIG. 1 schematically shows an excerpt from a cross-sectional side view of a semiconductor device 100, in accordance with the disclosure, which is mounted on a circuit board.

FIG. 1 schematically shows an excerpt from a cross-sectional side view of a semiconductor device 100 in accordance with the disclosure. The semiconductor device 100 can comprise a semiconductor chip 2 having a radio-frequency circuit (not shown) and a radio-frequency terminal 4. Furthermore, the semiconductor device 100 can comprise an encapsulation material 6, into which the semiconductor chip 2 can be at least partly embedded. Furthermore, the semiconductor device 100 can comprise an external radio-frequency terminal 8 (radio-frequency terminal for transmitting radio-frequency signals to an element outside the semiconductor device) and a redistribution layer 10, which electrically connects the radio-frequency terminal 4 of the semiconductor chip 2 and the external radio-frequency terminal 8 to one another. The semiconductor device 100 can be electrically and mechanically connected to a terminal 12 of a circuit board 14 by way of the external radio-frequency terminal 8. FIG. 1 illustrates only an excerpt from the semiconductor device 100 and the circuit board 14. The semiconductor device 100 can comprise further components, such as e.g. further terminals, which can be arranged for example to the right of a dashed line shown in FIG. 1.

The semiconductor chip 2 can operate in a radio-frequency or microwave frequency range that can generally range from approximately 10 GHz to approximately 300 GHz. By way of example, the radio-frequency circuit of the semiconductor chip 2 can operate in a frequency range of greater than 10 GHz. Microwave circuits of this type can comprise for example microwave transmitters, microwave receivers, microwave transceivers, microwave sensors or microwave detectors. The devices described herein can be used for radar applications in which the frequency of the radio-frequency signal is modulated. Radar microwave devices can be used for example in automotive or industrial applications for distance determining/distance measuring systems. By way of example, automatic vehicle speed regulating systems or vehicle anti-collision systems can operate in the microwave frequency range, for example in the 24 GHz, 77 GHz or 79 GHz frequency bands. The semiconductor chip 2 can be produced from an elemental semiconductor material (for example Si, etc.) or from a compound semiconductor material (e.g. GaN, SiC, SiGe, GaAs, etc.).

The radio-frequency terminal 4 of the semiconductor chip 2 can correspond to an output terminal of the semiconductor chip 2, which can provide a radio-frequency signal processed in the integrated circuits of the semiconductor chip 2 and having a frequency of greater than 10 GHz for outside the semiconductor chip 2. Such a radio-frequency signal can be coupled into the circuit board 14 by way of the redistribution layer 10 and the external radio-frequency terminal 8. As an alternative or in addition thereto, the radio-frequency terminal 4 can correspond to an input terminal of the semiconductor chip 2, by way of which signals can be fed into the semiconductor chip 2. By way of example, signals provided by the circuit board 14 can be transmitted to the radio-frequency terminal 4 of the semiconductor chip 2 by way of the external radio-frequency terminal 8 and the redistribution layer 10.

The semiconductor chip 2 can be at least partly embedded into the encapsulation material 6. In the example in FIG. 1, a side surface of the semiconductor chip 2 is covered by the encapsulation material 6. In further examples, the top side of the semiconductor chip 2 can also be covered by the encapsulation material 6. The semiconductor chip 2 can be protected against external influences, such as moisture, for example, by the encapsulation material 6. The encapsulation material 6 can comprise for example at least one from a mold compound, a laminate, an epoxy, a filled epoxy, a glass-fiber-filled epoxy, an imide, a thermoplastic, a thermosetting polymer, a polymer mixture.

Figure 3:
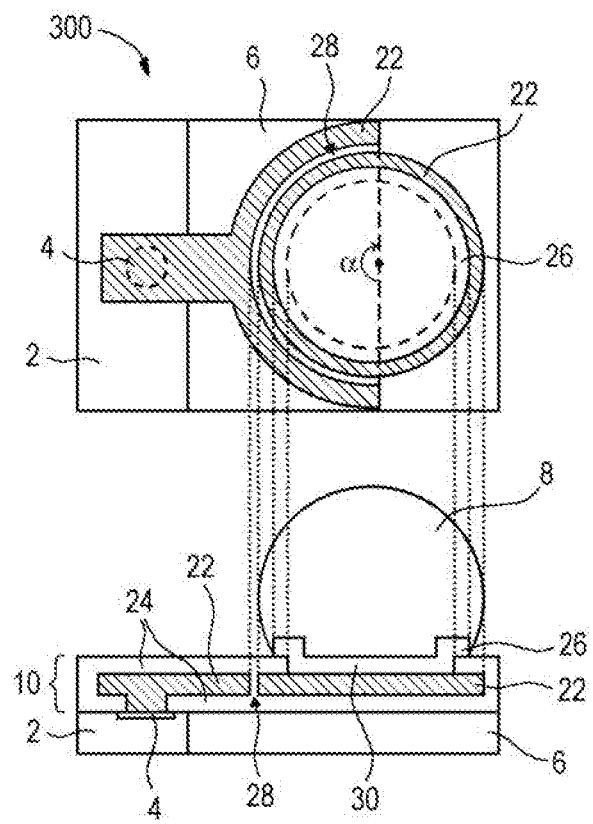
FIG. 3 schematically shows an excerpt from a plan view and from a cross-sectional side view of a semiconductor device 300 in accordance with the disclosure.

The redistribution layer (or redistribution wiring layer) 10 can contain one or more conductor tracks in the form of metal layers or metal tracks, which can run substantially parallel to the active underside of the semiconductor chip 2 or the top side of the circuit board 14. A multiplicity of dielectric layers can be arranged between the multiplicity of conductor tracks in order to electrically insulate the conductor tracks from one another. Furthermore, metal layers arranged on different planes can be electrically connected to one another by a multiplicity of through contacts (or vias). In the example in FIG. 1, the conductor tracks and dielectric layers of the redistribution layer 10 are not explicitly illustrated for the sake of simplicity. A more detailed construction of a redistribution layer is shown in FIG. 3, for example.

The conductor tracks of the redistribution layer 10 can fulfil the function of redistribution or redistribution wiring in order for example to electrically couple the radio-frequency terminal 4 of the semiconductor chip 2 to the external radio-frequency terminal 8. In other words, the conductor tracks can be designed to make terminals of the semiconductor chip 2 available at other positions of the semiconductor device 100. In the example in FIG. 1, using the redistribution layer 10, the terminals of the semiconductor chip 2 can be redistributed to external terminals which can be arranged outside the contour of the semiconductor chip 2. A semiconductor device having such spreading of the chip terminals can be referred to as a fan-out device or fan-out package. In one example, the semiconductor device 100 in FIG. 1 can be a wafer level package, e.g. an eWLB (embedded Wafer Level Ball Grid Array) package. It should be noted, however, that the semiconductor devices in accordance with the disclosure as described herein may not be configured as a fan-out package. In further examples, the external terminals can at least partly also be arranged within the contour of the semiconductor chip 2.

The internal electronic structures of the semiconductor chip 2 can be contacted from outside the semiconductor device 100 by way of the external radio-frequency terminal 8 and the redistribution layer 10. In this respect, the external radio-frequency terminal 8 can in particular be arranged at a periphery of the semiconductor device 100 and be electrically and mechanically contactable from outside the semiconductor device 100. The external radio-frequency terminal 8 can be designed in particular to couple an electrical signal provided by it into the circuit board 14 or into the terminal 12 of the circuit board 14. By way of example, the external radio-frequency terminal 8 can comprise at least one from a solder contact element and an under bump metallization. In the example in FIG. 1, the external radio-frequency terminal 8 is embodied for example in the form of a solder deposit or a solder ball.

Figure 2:
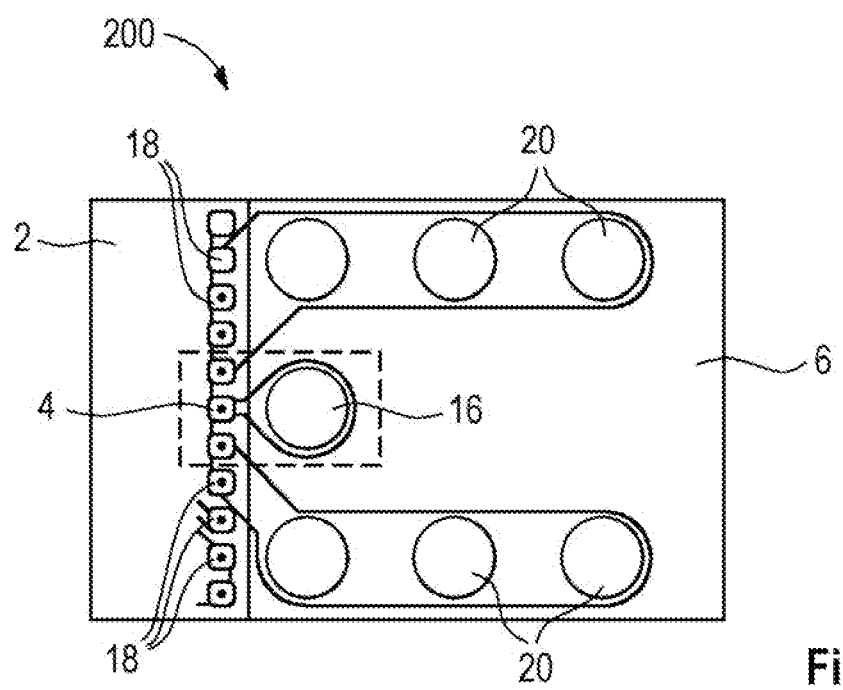
FIG. 2 schematically shows an excerpt from a plan view of a semiconductor device 200 in accordance with the disclosure.

FIG. 2 schematically shows an excerpt from a plan view of a semiconductor device 200 in accordance with the disclosure. The semiconductor device 200 can for example be similar to the semiconductor device 100 in FIG. 1 and comprise at least partly identical components.

The semiconductor device 200 can comprise a semiconductor chip 2 and an encapsulation material 6, which at least partly embeds the semiconductor chip 2. The contours of the semiconductor chip 2 and of the encapsulation material 6 are illustrated merely by way of example in FIG. 2. The semiconductor chip 2 can comprise at least one radio-frequency terminal 4 and also further terminals 18. The further terminals 18 can be for example signal terminals for analog or digital signals which the semiconductor chip 2 can provide, for example, to the circuit board 14, or can receive from the latter. Furthermore, the further terminals 18 can comprise for example at least one ground terminal of the semiconductor chip 2.

The radio-frequency terminal 4 and the further terminals 18 of the semiconductor chip 2 can be electrically connected to contact pads by way of a redistribution layer, which contact pads can be arranged above a surface of the encapsulation material 6. In this case, the radio-frequency terminal 4 of the semiconductor chip 2 can be electrically connected to a radio-frequency contact pad 16. The radio-frequency contact pad 16 can be for example a portion of a conductor track of the redistribution layer or an under bump metallization. The radio-frequency contact pad 16 can be regarded as an external radio-frequency terminal of the semiconductor device 200. As an alternative thereto, by way of example, a solder deposit (not shown) additionally arranged on the radio-frequency contact pad 16 can be regarded as an external radio-frequency terminal. The further terminals 18 of the semiconductor chip 2 can be electrically connected to further contact pads 20 in an analogous manner.

FIG. 3 schematically shows an excerpt from a semiconductor device 300 in accordance with the disclosure. In this case, the upper part of FIG. 3 shows a plan view of the semiconductor device 300, while the lower part of FIG. 3 illustrates a cross-sectional side view of the semiconductor device 300. The plan view and the cross-sectional side view are aligned relative to one another, the alignment of individual components of the device being indicated by dotted lines. The excerpt shown can be for example a more detailed illustration of that region of the semiconductor device 200 which is bounded by a dashed rectangle in FIG. 2. The further terminals 18 shown in FIG. 2 are not illustrated here for the sake of simplicity.

The semiconductor device 300 can comprise a semiconductor chip 2 having at least one radio-frequency terminal 4 and an encapsulation material 6, by which the semiconductor chip 2 can be at least partly encapsulated. Furthermore, the semiconductor device 300 can comprises a redistribution layer 10, an under bump metallization 26 and an external radio-frequency terminal 8. The external radio-frequency terminal 8 is not shown in the plan view in FIG. 3 for depiction reasons. The same can apply to the plan views in the further figures. The redistribution layer 10 can be designed to electrically couple the radio-frequency terminal 4 of the semiconductor chip 2 to the under bump metallization 26 or the external radio-frequency terminal 8. The redistribution layer 10 can comprise at least one conductor track 22 which can be embedded into dielectric layers 24. By way of example, one conductor track 22 and two dielectric layers 24 are illustrated in FIG. 3. In further examples, the redistribution layer 10 can comprise any other number of conductor tracks and dielectric layers.

The under bump metallization 26 can comprise, inter alia, a substantially perpendicularly extending via connection 30, which can be electrically connected to the conductor track 22 of the redistribution layer 10. In the example in FIG. 3, the external radio-frequency terminal 8 can partly cover the under bump metallization 26. In further examples, the under bump metallization 26 can be completely covered by the external radio-frequency terminal 8. For the case where the external radio-frequency terminal 8 embodied as a solder deposit, for example, is not yet arranged on the under bump metallization 26, the under bump metallization 26 can constitute an external radio-frequency terminal of the semiconductor device 300. It should be noted that the under bump metallization 26 is optional and may not be present in further examples. In such a case, the external radio-frequency terminal 8 can contact the conductor track 22 directly.

The semiconductor device 300 can comprise a non-galvanic connection 28. The non-galvanic connection 28 can be formed by an interruption in the electrical connection between the radio-frequency terminal 4 of the semiconductor chip 2 and the under bump metallization 26 or the external radio-frequency terminal 8. In the example in FIG. 3, such an non-galvanic connection 28 can be formed in a conductor track 22 of the redistribution layer 10. The terms "interruption" and "non-galvanic connection" may be used synonymously hereinafter.

In the cross-sectional side view in FIG. 3, the non-galvanic connection 28 can be formed as a horizontal slot in the conductor track 22. The non-galvanic connection 28 can thus be arranged in a part of the horizontal course of the conductor track 22. Furthermore, the non-galvanic connection 28 can have the shape of an arc of a circle in the plan view in FIG. 3. In the plan view in FIG. 3, the arc of a circle can extend at least partly around a contour of the under bump metallization 26 or around a contour of the external radio-frequency terminal 8. In the example in FIG. 1, the central angle α associated with the circumference of the arc of a circle has a value of approximately 180 degrees. In further examples, the angle α can have any other value between approximately 0 degrees and approximately 360 degrees. The possible shape of the non-galvanic connection 28 in plan view is not restricted to an arc of a circle. In further examples, the shape of the non-galvanic connection 28 in plan view can have a rectangular, elliptical or polygonal course. In the example of the cross-sectional side view in FIG. 3, the non-galvanic connection 28 can be arranged outside the contour of the under bump metallization 26 or of the external radio-frequency terminal 8 in a projection perpendicular to the conductor track 22.

That part of the conductor track 22 which is arranged next to the non-galvanic connection 28 on the left and on the right in FIG. 3 can be regarded as first and second electrical connection part, respectively. The distance of the non-galvanic connection 28 between the first and second connection parts can be substantially constant or vary. A maximum distance of the non-galvanic connection 28 between the first and second connection parts or a maximum width of the non-galvanic connection 28 can have a value in a range, wherein a lower limit of the range can be approximately 1 micrometer or approximately 5 micrometers, for example. An upper limit of the range can be approximately 50 micrometers or approximately 40 micrometers or approximately 30 micrometers or approximately 20 micrometers or approximately 10 micrometers, for example.

The non-galvanic connection 28 in the conductor track 22 can be filled with a dielectric material. In the example in FIG. 3, the non-galvanic connection 28 can be filled with the material of the dielectric layers 24 of the redistribution layer 10. In further examples, the material arranged in the non-galvanic connection 28 can differ from the dielectric material of the redistribution layer 10. The dielectric material in the non-galvanic connection 28 can comprise a polymer, such as, for example, a polyimide, a low-k material or air. The dielectric material can have for example a dielectric constant in a range of approximately 2 to approximately 6. Furthermore, the dielectric material can have a higher elasticity than the material of the conductor track 22. As explained further below, the higher elasticity of the dielectric material makes it possible to prevent cracks from occurring in the conductor track 22. Such cracks can be caused by material fatigue, for example.

The non-galvanic connection 28 can form an electrical capacitance and have properties of a capacitor. In this case, the capacitance value of the non-galvanic connection 28 can be influenced or set by way of at least one of the following parameters, for example: (1) the area size of the ends of the conductor track 22 between which the non-galvanic connection 28 is formed, (2) the width of the non-galvanic connection 28, and (3) the dielectric constant of the material arranged in the non-galvanic connection 28. In this regard, by way of example, a larger angle α of the arc of a circle can result in a larger area between the ends of the conductor track 22 and thus in a larger capacitance value. Furthermore, the capacitance value can be increased by reducing the maximum width of the non-galvanic connection 28 and by increasing the dielectric constant of the material arranged in the non-galvanic connection 28.

The non-galvanic connection 28 can be designed, in particular, to transmit a radio-frequency signal. In this case, the signal transmission by way of the non-galvanic connection 28 can be effected using capacitive coupling. That is to say that the non-galvanic connection 28 can have the functionality of a coupling capacitor. The non-galvanic connection 28 can be formed in radio-frequency signal lines, in particular, since, on account of their relatively high frequency values, radio-frequency signals may not be interrupted during the transmission by way of the non-galvanic connection 28. A damping of the radio-frequency signals can occur during the transmission by way of the non-galvanic connection 28. Such a signal attenuation can be reduced by choosing a high electrical capacitance value of the non-galvanic connection 28, as already discussed above.

The non-galvanic connection 28 can be arranged in particular at such locations of the semiconductor device 300 at which thermomechanical loads can occur during production or operation of the semiconductor device 300. By way of example, such loads can occur in the context of Temperature Cycling on Board (TCoB) on account of different coefficients of thermal expansion of the components of the semiconductor device 300 and the circuit board 14. The loads can lead, inter alia, to material fatigue of the conductor tracks 22, as a result of which cracks can arise in the conductor tracks 22. Since the material arranged in the non-galvanic connection 28 can have a higher elasticity than the material of the conductor tracks 22, it is possible to prevent such cracking in the conductor tracks 22. The reliability and performance of the semiconductor device 300 can be improved as a result.

The non-galvanic connection 28 can be designed to provide a defined phase shift of a radio-frequency signal transmitted by way of the non-galvanic connection 28. Such a phase shift can be controlled and predictable and can remain constant over the entire life cycle of the semiconductor device 300 in the ideal case. In contrast thereto, cracks in the conductor track 22 that are caused by material fatigue can result in uncontrolled and unpredictable phase shifts.

Figure 4:
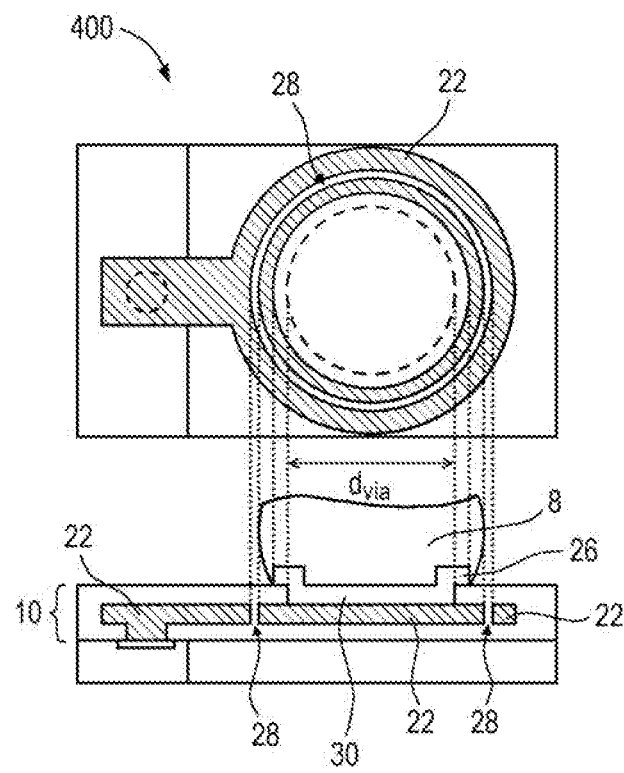
FIG. 4 schematically shows an excerpt from a plan view and from a cross-sectional side view of a semiconductor device 400 in accordance with the disclosure.

FIG. 4 schematically shows an excerpt from a semiconductor device 400 in accordance with the disclosure. In this case, the upper part of FIG. 4 shows a plan view of the semiconductor device 400, while the lower part of FIG. 4 illustrates a cross-sectional side view of the semiconductor device 400. The semiconductor device 400 can be at least partly similar to the semiconductor device 300 in FIG. 3, for example, such that explanations above concerning FIG. 3 may also be applicable to FIG. 4.

In contrast to FIG. 3, the non-galvanic connection 28 in the plan view in FIG. 4 can have the shape of a completely closed circle. In other words, the example in FIG. 4 can correspond to the example in FIG. 3 in the case of an angle α of 360 degrees. An electrical capacitance value of the non-galvanic connection 28 can be increased by virtue of the increased area—in comparison with FIG. 3—of the capacitor formed by the non-galvanic connection 28. That is to say that a damping of a radio-frequency signal transmitted by way of the non-galvanic connection 28 can be reduced. In the cross-sectional side view in FIG. 4, the external radio-frequency terminal 8 is not shown completely for depiction reasons. The same may be applicable to the cross-sectional side views in the further figures.

Figure 5:
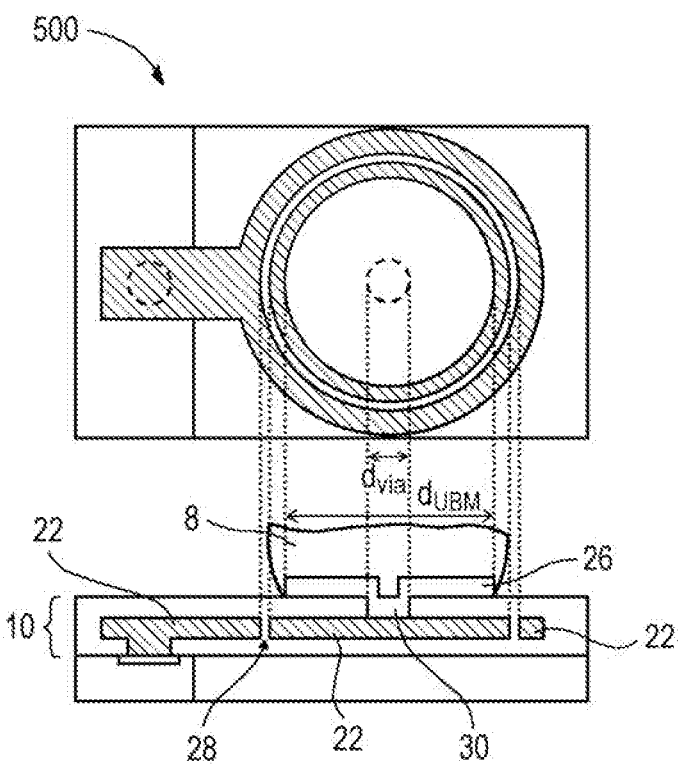
FIG. 5 schematically shows an excerpt from a plan view and from a cross-sectional side view of a semiconductor device 500 in accordance with the disclosure.

FIG. 5 schematically shows an excerpt from a semiconductor device 500 in accordance with the disclosure. In this case, the upper part of FIG. 5 shows a plan view of the semiconductor device 500, while the lower part of FIG. 5 illustrates a cross-sectional side view of the semiconductor device 500. The semiconductor device 500 can be at least partly similar to the semiconductor device 400 in FIG. 4, for example.

In contrast to FIG. 4, the via connection 30 of the under bump metallization 26 in FIG. 5 can have a smaller diameter $d_{via}$. A reduction of the diameter $d_{via}$ makes it possible to reduce mechanical loads that can possibly occur in the case of a connection between the external radio-frequency terminal 8 and the redistribution layer 10. The risk of cracks in the redistribution layer 10 can be reduced as a result. In FIG. 4, the diameter $d_{via}$ can have an example value of approximately 240 micrometers, while the diameter $d_{via}$ in FIG. 5 can have an example value of approximately 50 micrometers. In the example in FIG. 5, a ratio between the diameter $d_{via}$ of the via connection 30 and the diameter $d_{UBM}$ of the under bump metallization 26 can be less than approximately 0.5, or less than approximately 0.4, or less than approximately 0.3, or less than approximately 0.2, or less than approximately 0.1.

Figure 6:
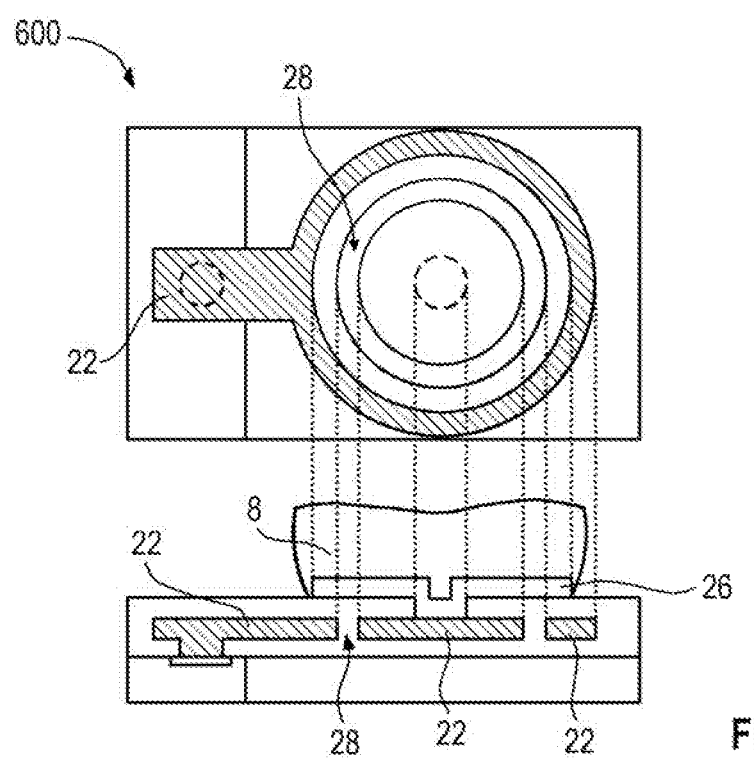
FIG. 6 schematically shows an excerpt from a plan view and from a cross-sectional side view of a semiconductor device 600 in accordance with the disclosure.

FIG. 6 schematically shows an excerpt from a semiconductor device 600 in accordance with the disclosure. In this case, the upper part of FIG. 6 shows a plan view of the semiconductor device 600, while the lower part of FIG. 6 illustrates a cross-sectional side view of the semiconductor device 600. The semiconductor device 600 can be at least partly similar to the semiconductor device 500 in FIG. 5, for example.

In contrast to FIG. 5, the non-galvanic connection 28 in FIG. 6 can be arranged within the contour of the under bump metallization 26 or of the external radio-frequency terminal 8 in a projection perpendicular to the conductor track 22.

Figure 7:
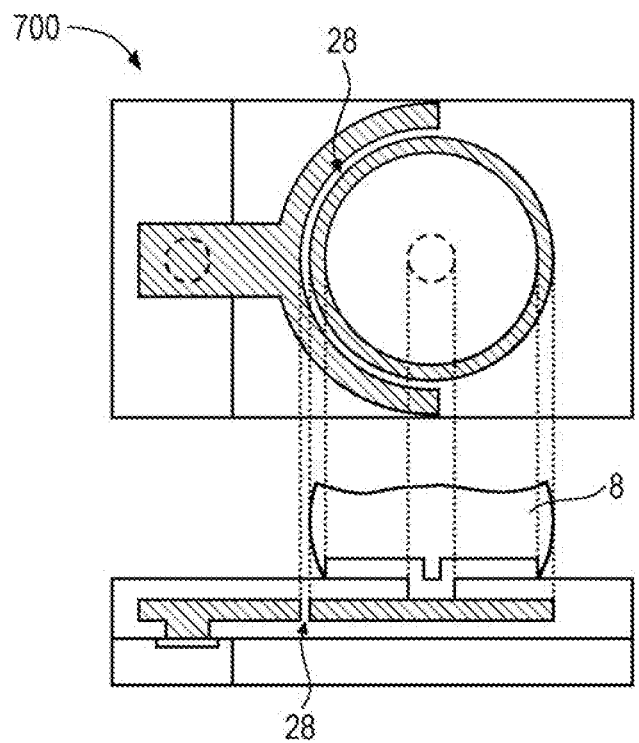
FIG. 7 schematically shows an excerpt from a plan view and from a cross-sectional side view of a semiconductor device 700 in accordance with the disclosure.

FIG. 7 schematically shows an excerpt from a semiconductor device 700 in accordance with the disclosure. In this case, the upper part of FIG. 7 shows a plan view of the semiconductor device 700, while the lower part of FIG. 7 illustrates a cross-sectional side view of the semiconductor device 700. The semiconductor device 700 can be at least partly similar to the semiconductor device 500 in FIG. 5, for example.

In contrast to FIG. 5, the non-galvanic connection 28 in the plan view in FIG. 7 can have the shape of an arc of a circle. In the example in FIG. 7, the central angle associated with the circumference of the arc of a circle can have a value of approximately 180 degrees. In further examples, the value of the angle can have any other value between approximately 0 degrees and approximately 360 degrees.

Figure 8:
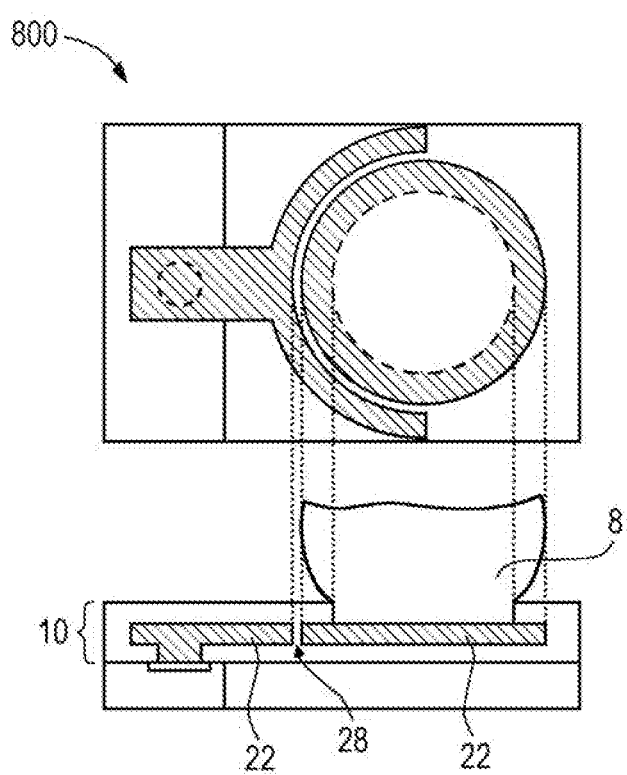
FIG. 8 schematically shows an excerpt from a plan view and from a cross-sectional side view of a semiconductor device 800 in accordance with the disclosure.

FIG. 8 schematically shows an excerpt from a semiconductor device 800 in accordance with the disclosure. In this case, the upper part of FIG. 8 shows a plan view of the semiconductor device 800, while the lower part of FIG. 8 illustrates a cross-sectional side view of the semiconductor device 800. The semiconductor device 800 can be at least partly similar to the semiconductor device 300 in FIG. 3, for example.

In contrast to FIG. 3, the semiconductor device 800 in FIG. 8 can comprise no under bump metallization. The external radio-frequency terminal 8 can contact a conductor track 22 of the redistribution layer 10 directly. For the case where the external radio-frequency terminal 8 embodied as a solder deposit, for example, has not yet been arranged on the conductor track 22, the exposed part of the conductor track 22 can be regarded as an external radio-frequency terminal of the semiconductor device 800.

Figure 9:
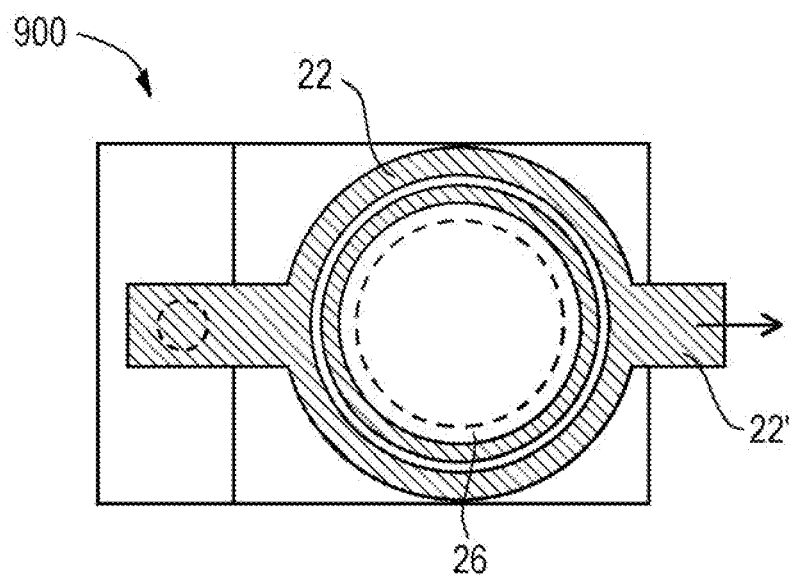
FIG. 9 schematically shows an excerpt from a plan view of a semiconductor device 900 in accordance with the disclosure.

FIG. 9 schematically shows an excerpt from a plan view of a semiconductor device 900 in accordance with the disclosure. The semiconductor device 900 can be at least partly similar to the semiconductor device 400 in FIG. 4, for example.

In contrast to FIG. 4, the conductor track 22 in FIG. 9 can have a further portion 22', e.g. having a straight shape. A radio-frequency signal transmitted by way of the conductor track 22 here not only can be provided to an external radio-frequency terminal, but moreover can be forwarded to further components of the semiconductor device 900. The direction of a possible signal course is indicated by an arrow in the example in FIG. 9. By way of example, the radio-frequency signal can be forwarded to at least one further external radio-frequency terminal (not shown) and be made available thereto. The further external radio-frequency terminal can be a redundant terminal having the same functionality.

Figure 10:
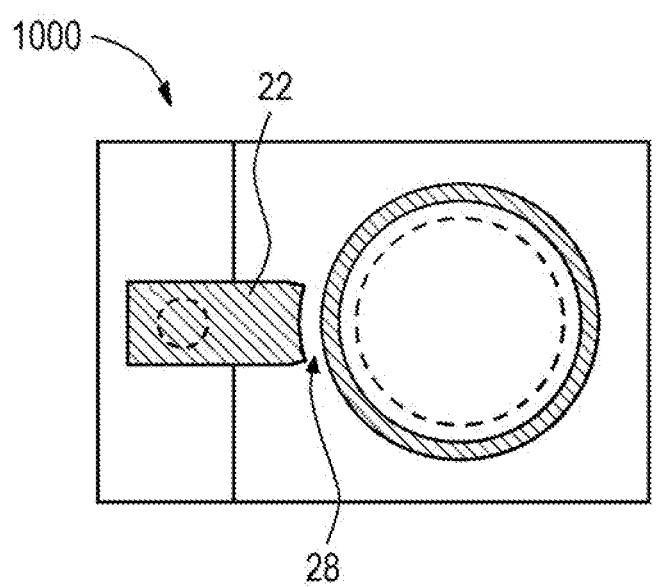
FIG. 10 schematically shows an excerpt from a plan view of a semiconductor device 1000 in accordance with the disclosure.

FIG. 10 schematically shows an excerpt from a plan view of a semiconductor device 1000 in accordance with the disclosure. The semiconductor device 1000 can be at least partly similar to the semiconductor device 300 in FIG. 3, for example.

In contrast to FIG. 3, the angle α in FIG. 10 can have a smaller value. In the plan view in FIG. 10, the non-galvanic connection 28 can have the shape of a relatively short arc of a circle. In comparison with FIG. 3, the electrical capacitance value of the non-galvanic connection 28 in FIG. 10 can accordingly be lower.

Figure 11:
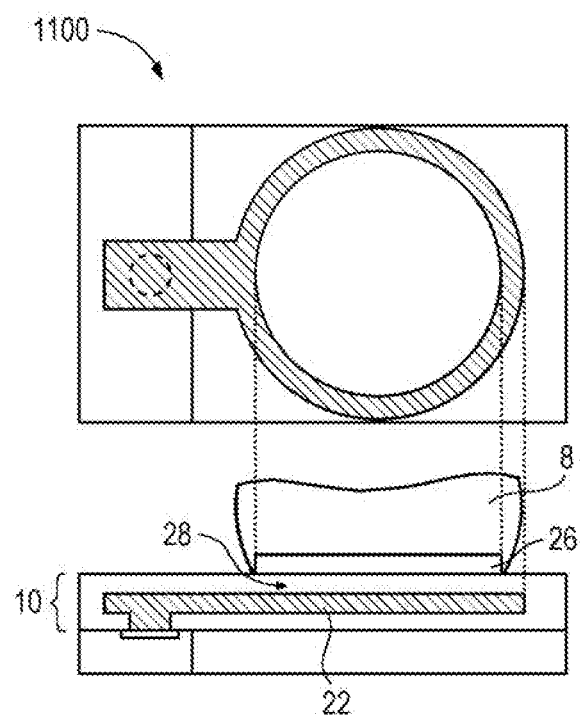
FIG. 11 schematically shows an excerpt from a plan view and from a cross-sectional side view of a semiconductor device 1100 in accordance with the disclosure.

FIG. 11 schematically shows an excerpt from a semiconductor device 1100 in accordance with the disclosure. In this case, the upper part of FIG. 11 shows a plan view of the semiconductor device 1100, while the lower part of FIG. 11 illustrates a cross-sectional side view of the semiconductor device 1100. The semiconductor device 1100 can be at least partly similar to the semiconductor device 300 in FIG. 3, for example.

In contrast to FIG. 3, the non-galvanic connection 28 in FIG. 11 may not be formed in the conductor track 22 or in a horizontal course of the conductor track 22. Instead, the non-galvanic connection 28 can be formed between the conductor track 22 of the redistribution layer 10 and the under bump metallization 26 or the external radio-frequency terminal 8. In the example in FIG. 11, the non-galvanic connection 28 is arranged directly between the top side of the conductor track 22 and the underside of the under bump metallization 26, that is to say that it is bounded by these two components. While the non-galvanic connection 28 in the cross-sectional side view in FIG. 3 was formed as a "horizontal" slot, the non-galvanic connection 28 in the cross-sectional side view in FIG. 11 can be formed as a "vertical" slot. The non-galvanic connection 28 can be arranged in a part of the vertical signal course of the redistribution layer 10. For this purpose, by way of example, it is possible to dispense with a via connection for connecting the conductor track 22 to the under bump metallization 26, such that the region between the top side of the conductor track 22 and the underside of the under bump metallization 26 can be filled with the dielectric material of the redistribution layer 10. Analogously to the previous examples, the dielectric material arranged in the non-galvanic connection 28 can absorb thermomechanical loads that possibly occur, on account of its elasticity.

Figure 12:
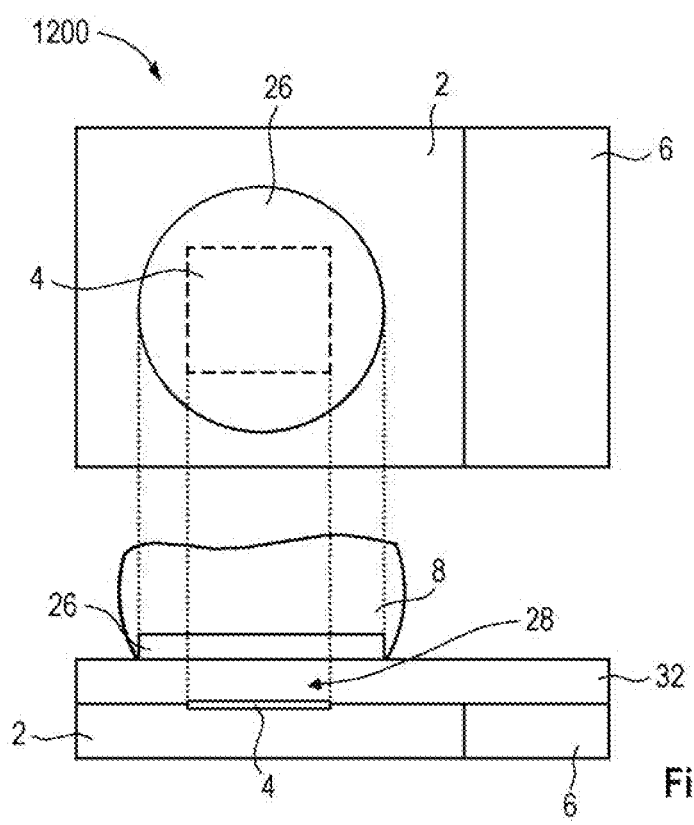
FIG. 12 schematically shows an excerpt from a plan view and from a cross-sectional side view of a semiconductor device 1200 in accordance with the disclosure.

FIG. 12 schematically shows an excerpt from a semiconductor device 1200 in accordance with the disclosure. In this case, the upper part of FIG. 12 shows a plan view of the semiconductor device 1200, while the lower part of FIG. 12 illustrates a cross-sectional side view of the semiconductor device 1200. The semiconductor device 1200 can be at least partly similar to the previously discussed semiconductor devices in accordance with the disclosure.

The semiconductor device 1200 can comprise a semiconductor chip 2 having at least one radio-frequency terminal 4 and an encapsulation material 6, by which the semiconductor chip 2 can be at least partly encapsulated. Furthermore, a dielectric layer 32 can be applied above the top sides of the semiconductor chip 2 and of the encapsulation material 6. Above the dielectric layer 32 it is possible to arrange an under bump metallization 26 and an external radio-frequency terminal 8 thereof.

In the plan view in FIG. 12, the radio-frequency terminal 4 of the semiconductor chip 2 can be arranged within the contour of the under bump metallization 26 or within the contour of the external radio-frequency terminal 8. In other words, the external radio-frequency terminal 8 can be positioned directly above the radio-frequency terminal 4 of the semiconductor chip 2. In this respect, the semiconductor device 1200, at least in the region shown in FIG. 12, may not have a redistribution layer that provides an electrical connection between the radio-frequency terminal 4 of the semiconductor chip 2 and the external radio-frequency terminal 8.

In this context, it should be noted that at least one part of the encapsulation material 6 adjoining the side surfaces of the semiconductor chip 2 can be optional. In one example, the semiconductor device 1200 can indeed be a fan-out package having an encapsulation material 6 projecting beyond the contour of the semiconductor chip 2. In further examples, however, the external terminals of the semiconductor device 1200 can also be arranged within the contour of the semiconductor chip 2, such that the encapsulation material 6 can be dispensed with at least at the side surfaces of the semiconductor chip 2.

In the example in FIG. 12, the non-galvanic connection 28 or the interruption can be formed directly between the radio-frequency terminal 4 of the semiconductor chip 2 and the under bump metallization 26 or the external radio-frequency terminal 8. That is to say that the non-galvanic connection 28 can be bounded in particular by the top side of the radio-frequency terminal 4 and the underside of the under bump metallization 26.

Figure 13:
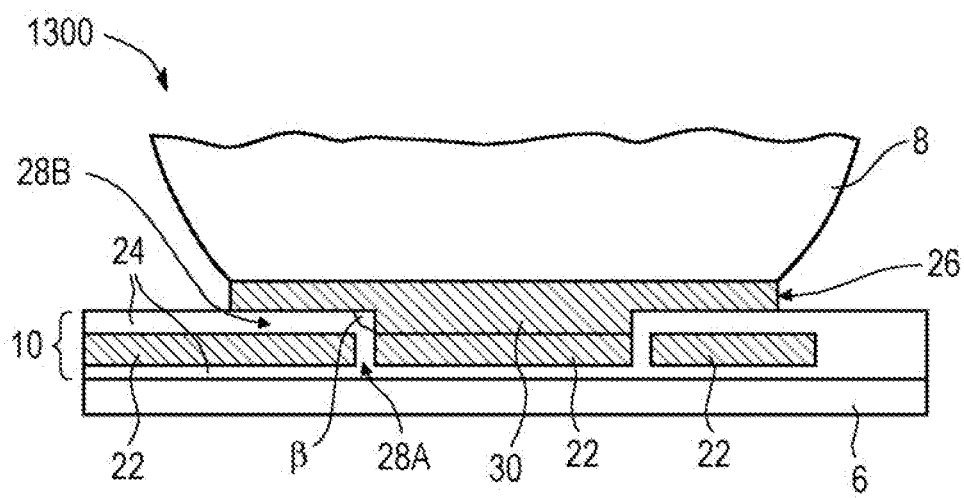
FIG. 13 schematically shows an excerpt from a cross-sectional side view of a semiconductor device 1300 in accordance with the disclosure.

FIG. 13 schematically shows an excerpt from a cross-sectional side view of a semiconductor device 1300 in accordance with the disclosure. The semiconductor device 1300 can be at least partly similar to the previously described semiconductor devices in accordance with the disclosure.

In the example in FIG. 13, the non-galvanic connection 28 or the interruption can have both a horizontal course and a vertical course. The non-galvanic connection 28 in FIG. 13 can accordingly be regarded for example as a combination of the non-galvanic connections 28 28 in FIGS. 3 and 11. In the cross-sectional side view in FIG. 13, the non-galvanic connection 28 can have a first portion 28A and a second portion 28B, which can be arranged at an angle β with respect to one another. In the example in FIG. 13, the angle β can have a value of approximately 90 degrees, wherein the first portion 28A can form a "horizontal" slot and the second portion 28B can form a "vertical" slot. In further examples, the angle β can also be an acute or obtuse angle. In the view in FIG. 13, the non-galvanic connection 28 can have a non-constant width in a perpendicular direction. Furthermore, in the view in FIG. 13, the first portion 28A of the non-galvanic connection 28 can be arranged below the external radio-frequency terminal 8.

As already mentioned above, a damping of the radio-frequency signal can occur in the case of a transmission of a radio-frequency signal by way of a non-galvanic connection in comparison with a corresponding transmission by way of a galvanic connection. The damping can be dependent here on a layout and a width of the non-galvanic connection, inter alia. For the case of a "horizontal" non-galvanic connection 28, the damping can be in a range of approximately 0.1 dB to approximately 0.5 dB. In the example in FIG. 4, the damping can have a value of approximately 0.2 dB. In the example in FIG. 5, the damping can have a value of approximately 0.4 dB. In the example in FIG. 6, the damping can have a value of approximately 0.1 dB. For the case of a "vertical" non-galvanic connection 28 (see e.g. FIG. 11), the non-galvanic connection can provide a performance which can be very similar to the performance of a corresponding galvanic connection.

Each of the examples described shows only one non-galvanic connection between the radio-frequency terminal 4 of the semiconductor chip 2 and the external radio-frequency terminal 8 of the semiconductor device. In further examples, a semiconductor device in accordance with the disclosure can also comprise more than one non-galvanic connection. In this case, the possible implementations of the non-galvanic connections as described herein can be combined with one another in any desired manner. In one example, two non-galvanic connections can be formed in one and the same conductor track. In a further example, two non-galvanic connections can be formed in different conductor tracks of a redistribution layer. In yet another example, it is possible for a non-galvanic connection comprised of a multiplicity of horizontal and vertical slots to be combined with one another in any desired manner.

In the examples described, non-galvanic connections are formed in semiconductor devices in accordance with the disclosure. As an alternative or in addition thereto, in further examples, one or more non-galvanic connections can be formed in the circuit board 14 (see FIG. 1). In this case, such a non-galvanic connection can be arranged in particular between a terminal 12 of the circuit board 14 and an internal electrical structure of the circuit board 14. The non-galvanic connection can be designed to transmit a radio-frequency signal. In this case, the non-galvanic connection in the circuit board 14 can be formed in accordance with the previously described examples for non-galvanic connections in semiconductor devices. By way of example, the non-galvanic connection can be embodied in the circuit board 14 in a horizontal and/or vertical direction, as described above.

Figure 14:
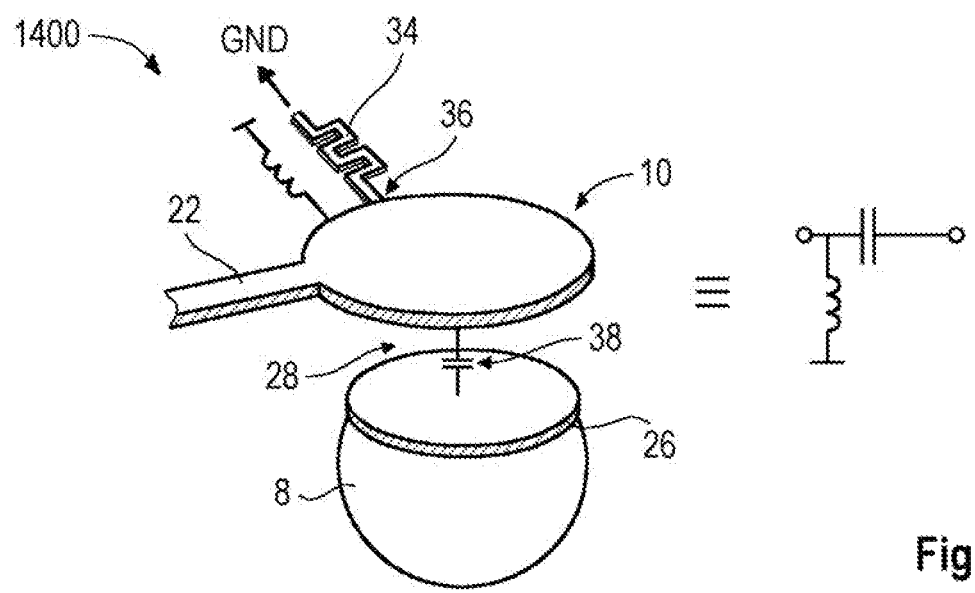
FIG. 14 schematically shows an excerpt from a perspective view of a semiconductor device 1400 in accordance with the disclosure.

FIG. 14 schematically shows an excerpt from a perspective view of a semiconductor device 1400 in accordance with the disclosure. The excerpt shown can for example be contained in one of the semiconductor devices described above and have similar components.

The semiconductor device 1400 contains a redistribution layer 10 having at least one conductor track 22. For the sake of simplicity, no dielectric layers of the redistribution layer 10 are illustrated in FIG. 14. The redistribution layer 10 is electrically coupled by way of a non-galvanic connection 28 to an under bump metallization 26 or an external radio-frequency terminal 8 arranged thereabove. An electrical capacitance 38 formed by the non-galvanic connection 28 is symbolized by a circuit symbol of a capacitor in FIG. 14. An inductor 34 can be connected by one end to the conductor track 22 at a terminal 36. By another end, the inductor 34 can be coupled to a ground potential (see "GND"). The inductor 34 can be formed in the redistribution layer 10 in order to provide a low-resistance DC path to the ground potential. In the example in FIG. 14, the inductor 34 is formed in the shape of a meandering inductor and is symbolized by a circuit symbol of an inductor. The right-hand side of FIG. 14 shows a circuit corresponding to the shown excerpt from the semiconductor device 1400. In the example in FIG. 14, the semiconductor device 1400 includes only one inductor. In further examples, the semiconductor device 1400 can comprise at least one further inductor, as described below.

The electrical capacitance 38 can provide a natural direct current (DC) isolation ("DC block") for radio-frequency signals. Furthermore, the functionality of at least one from electrostatic discharge (ESD) protection and a radio-frequency filter can be provided by the inductor 34 and the electrical capacitance 38. In this case, the inductor 34 in the example in FIG. 14 can be arranged between the non-galvanic connection 28 and a radio-frequency terminal 4 of a semiconductor chip 2. As an alternative or in addition thereto, the inductor 34 or an additional inductor in further examples can be connected between the non-galvanic connection 28 and the external radio-frequency terminal 8 of the semiconductor device 1400.

FIG. 15 shows a circuit having an electrical capacitance formed by a non-galvanic connection. In this case, the electrical capacitance is arranged between a radio-frequency terminal of a semiconductor chip (see "Chip") and an external radio-frequency terminal of the semiconductor device that is coupled to a circuit board (see "PCB"). The circuit points depicted as circles here represent possibilities of connection for a DC path to the ground potential. As already mentioned above, the electrical capacitance can provide a direct current (DC) isolation ("DC block") for radio-frequency signals. In this context, the right-hand side of FIG. 15 shows a qualitative filter characteristic of the circuit illustrated, a gain $S_{21}$ (in dB) being plotted against the frequency f. It is evident from the filter characteristic that the circuit can provide the functionality of a high-pass filter.

In comparison with FIG. 15, FIG. 16 shows a circuit having an additional inductor. In one example, the inductance L of the inductor can assume a value of greater than 1 nH. By way of example, the inductor can be connected to a terminal 36 of a redistribution layer 10 as illustrated in FIG. 14. The circuit in FIG. 16 can have the functionality of a direct current (DC) isolation ("DC block") for radio-frequency signals, of a high-pass filter and of chip-side ESD protection. In this context, the right-hand side of FIG. 16 shows a qualitative filter characteristic of the circuit illustrated.

In comparison with FIG. 16, FIG. 17 shows a circuit having yet another, second inductor. Analogously to the first inductor already present, the further, second inductor can provide a low-resistance DC path to the ground potential. The circuit in FIG. 17 can have the functionality of a direct current (DC) isolation ("DC block") for radio-frequency signals, of a high-pass filter and of chip-side and circuit-board-side ESD protection. In this context, the right-hand side of FIG. 17 shows a qualitative filter characteristic of the circuit illustrated.

In comparison with FIG. 17, FIG. 18 shows a circuit having yet another, third inductor. The circuit in FIG. 18 can have the functionality of a direct current (DC) isolation ("DC block") for radio-frequency signals, of a high-pass filter and of chip-side and circuit-board-side ESD protection. In this context, the right-hand side of FIG. 18 shows a qualitative filter characteristic of the circuit illustrated.

FIG. 19 illustrates a flow diagram of a method for producing a semiconductor device in accordance with the disclosure. The method can be used to produce one of the semiconductor devices described above.

At 40 a non-galvanic connection is formed between a radio-frequency terminal of a semiconductor chip of the semiconductor device and an external radio-frequency terminal of the semiconductor device. The non-galvanic connection is designed to transmit a radio-frequency signal.

In a further action, the method in FIG. 19 can comprise forming a redistribution layer between the radio-frequency terminal of the semiconductor chip and the external radio-frequency terminal. Conductor tracks of the redistribution layer can be produced for example by sputtering, electroless deposition, vapor phase deposition. Dielectric layers of the redistribution layer can for example be deposited from a vapor phase or a solution or be laminated. Structuring of the components of the redistribution layer can be carried out for example using photolithographic processes, etching processes and/or laser drilling. In this case, forming the non-galvanic connection can be carried out during the production or structuring of the redistribution layer.

EXAMPLES

Semiconductor devices having a non-galvanic connection and associated production methods are explained below on the basis of examples.

Example 1 is a semiconductor device, comprising: a semiconductor chip having a radio-frequency circuit and a radio-frequency terminal; an external radio-frequency terminal; and a non-galvanic connection arranged between the radio-frequency terminal of the semiconductor chip and the external radio-frequency terminal, wherein the non-galvanic connection is designed to transmit a radio-frequency signal.

Example 2 is a semiconductor device according to example 1, wherein the radio-frequency circuit is designed to operate in a frequency range of greater than 10 GHz.

Example 3 is a semiconductor device according to example 1 or 2, wherein the non-galvanic connection is formed by an interruption in an electrical connection between the radio-frequency terminal of the semiconductor chip and the external radio-frequency terminal.

Example 4 is a semiconductor device according to example 3, wherein the interruption is formed in a conductor track of a redistribution layer.

Example 5 is a semiconductor device according to example 4, wherein the interruption in the conductor track has the shape of an arc of a circle or the shape of a completely closed circle.

Example 6 is a semiconductor device according to any of examples 3 to 5, wherein the interruption is formed between a conductor track of a redistribution layer and the external radio-frequency terminal.

Example 7 is a semiconductor device according to any of examples 3 to 6, wherein the interruption is formed directly between the radio-frequency terminal of the semiconductor chip and the external radio-frequency terminal.

Example 8 is a semiconductor device according to any of examples 3 to 7, wherein the interruption is arranged below the external radio-frequency terminal in a projection perpendicular to the conductor track.

Example 9 is a semiconductor device according to any of examples 3 to 8, wherein the interruption is formed between a first electrical connection part and a second electrical connection part and a maximum distance of the interruption between the first and second connection parts lies in a range of 1 micrometer to 50 micrometers.

Example 10 is a semiconductor device according to any of examples 3 to 9, wherein the interruption is filled with a dielectric material, wherein the dielectric material has a higher elasticity than the material of the electrical connection, and wherein the dielectric material has a dielectric constant in a range of 2 to 6.

Example 11 is a semiconductor device according to any of examples 3 to 10, wherein the interruption is filled with a dielectric material of a redistribution layer.

Example 12 is a semiconductor device according to any of the preceding examples, furthermore comprising: at least one inductor, wherein an electrical capacitance formed by the non-galvanic connection and the at least one inductor provide the functionality of at least one from ESD protection and a radio-frequency filter.

Example 13 is a semiconductor device according to example 12, wherein the at least one inductor is connected between the non-galvanic connection and the radio-frequency terminal of the semiconductor chip and/or between the non-galvanic connection and the external radio-frequency terminal.

Example 14 is a semiconductor device according to any of the preceding examples, furthermore comprising: an encapsulation material, wherein the semiconductor chip is at least partly encapsulated by the encapsulation material, wherein the external radio-frequency terminal comprises a fan-out terminal arranged above the encapsulation material.

Example 15 is a semiconductor device according to any of the preceding examples, wherein the external radio-frequency terminal comprises at least one from a solder contact element and an under bump metallization.

Example 16 is a semiconductor device according to example 15, furthermore comprising: an electrical via connection between the under bump metallization and a conductor track of a redistribution layer, wherein a ratio between a diameter of the via connection and a diameter of the under bump metallization is less than 0.5.

Example 17 is a semiconductor device according to any of the preceding examples, wherein the non-galvanic connection is designed to provide a defined phase shift of a radio-frequency signal transmitted by way of the non-galvanic connection.

Example 18 is a semiconductor device according to any of the preceding examples, furthermore comprising: a circuit board, wherein the external radio-frequency terminal is electrically connected to a terminal of the circuit board; and a further non-galvanic connection arranged between the terminal of the circuit board and an internal electrical structure of the circuit board, wherein the further non-galvanic connection is designed to transmit a radio-frequency signal.

Example 19 is a method for producing a semiconductor device, wherein the method comprises: forming a non-galvanic connection between a radio-frequency terminal of a semiconductor chip of the semiconductor device and an external radio-frequency terminal of the semiconductor device, wherein the non-galvanic connection is designed to transmit a radio-frequency signal.

Example 20 is a method according to example 19, furthermore comprising: forming a redistribution layer between the radio-frequency terminal of the semiconductor chip and the external radio-frequency terminal, wherein forming the non-galvanic connection is carried out during the structuring of the redistribution layer.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Furthermore, the word "above" used for example with respect to a material layer that is formed "above" a surface of an object or is situated "above" the surface can be used in the present description in the sense that the material layer is arranged (for example formed, deposited, etc.) "directly on", for example in direct contact with, the surface meant. The word "above" used for example with respect to a material layer that is formed or arranged "above" a surface can also be used in the present text in the sense that the material layer is arranged (e.g. formed, deposited, etc.) "indirectly on" the surface meant, wherein for example one or more additional layers are situated between the surface meant and the material layer.

In so far as the terms "have", "contain", "encompass", "having" or variants thereof are used either in the detailed description or the claims, these terms are intended to be inclusive in a similar manner to the term "comprise". That is to say that within the meaning of the present description the terms "have", "contain", "encompass", "having", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "exemplary" is used in the present text in the sense that it serves as an example, a case or an illustration. An aspect or a configuration that is described as "exemplary" in the present text should not necessarily be understood in the sense as though it has advantages over other aspects or configurations. Rather, the use of the word "exemplary" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say that if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A and B or the like generally means A or B or both A and B.

Devices and methods for producing devices are described in the present description. Observations made in connection with a device described can also apply to a corresponding method, and vice versa. If a specific component of a device is described, for example, then a corresponding method for producing the device can contain an action for providing the component in a suitable manner, even if such an action is not explicitly described or illustrated in the figures. Moreover, the features of the various example aspects described in the present text can be combined with one another, unless expressly noted otherwise.

Although the disclosure has been shown and described with respect to one or more implementations, equivalent alterations and modifications based at least in part on the reading and to understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function of the example implementations of the disclosure as presented herein. Furthermore, even if a specific feature of the disclosure has been disclosed with respect to only one of various implementations, such a feature can be combined with one or more other features of the other implementations in a manner such as is desired and advantageous for a given or specific application.

What is claimed is:

1. A semiconductor device, comprising:
    a semiconductor chip having a radio-frequency circuit and a radio-frequency terminal;
    an external radio-frequency terminal which is designed to connect the semiconductor device electrically and mechanically to a circuit board; and
    a non-galvanic connection arranged between the radio-frequency terminal of the semiconductor chip and the external radio-frequency terminal, wherein the non-galvanic connection is designed to transmit a radio-frequency signal.

2. The semiconductor device as claimed in claim 1, wherein the radio-frequency circuit is designed to operate in a frequency range of greater than 10 GHz.

3. The semiconductor device as claimed in claim 1, wherein the non-galvanic connection is formed by an interruption in an electrical connection between the radio-frequency terminal of the semiconductor chip and the external radio-frequency terminal.

4. The semiconductor device as claimed in claim 3, wherein the interruption is formed in a conductor track of a redistribution layer.

5. The semiconductor device as claimed in claim 4, wherein the interruption in the conductor track has a shape of an arc of a circle or a shape of a completely closed circle.

6. The semiconductor device as claimed in claim 3, wherein the interruption is formed between a conductor track of a redistribution layer and the external radio-frequency terminal.

7. The semiconductor device as claimed in claim 3, wherein the interruption is formed directly between the radio-frequency terminal of the semiconductor chip and the external radio-frequency terminal.

8. The semiconductor device as claimed in claim 4, wherein the interruption is arranged below the external radio-frequency terminal in a projection perpendicular to the conductor track.

9. The semiconductor device as claimed in claim 3, wherein the interruption is formed between a first electrical connection part and a second electrical connection part and a maximum distance of the interruption between the first electrical connection part and the second electrical connection part lies in a range of 1 micrometer to 50 micrometers.

10. The semiconductor device as claimed in claim 3, wherein the interruption is filled with a dielectric material, wherein the dielectric material has a higher elasticity than a material of the electrical connection, and wherein the dielectric material has a dielectric constant in a range of 2 to 6.

11. The semiconductor device as claimed in claim 3, wherein the interruption is filled with a dielectric material of a redistribution layer.

12. The semiconductor device as claimed in claim 1, further comprising:
at least one inductor, wherein an electrical capacitance formed by the non-galvanic connection and the at least one inductor provide functionality of at least one from electrostatic discharge protection and a radio-frequency filter.

13. The semiconductor device as claimed in claim 12, wherein the at least one inductor is connected at least one of:
between the non-galvanic connection and the radio-frequency terminal of the semiconductor chip, or
between the non-galvanic connection and the external radio-frequency terminal.

14. The semiconductor device as claimed in claim 1, further comprising:
an encapsulation material, wherein the semiconductor chip is at least partly encapsulated by the encapsulation material, wherein the external radio-frequency terminal comprises a fan-out terminal arranged above the encapsulation material.

15. The semiconductor device as claimed in claim 1, wherein the external radio-frequency terminal comprises at least one of a solder contact element or an under bump metallization.

16. The semiconductor device as claimed in claim 15, further comprising:
an electrical via connection between the under bump metallization and a conductor track of a redistribution layer, wherein a ratio between a diameter of the electrical via connection and a diameter of the under bump metallization is less than 0.5.

17. The semiconductor device as claimed in claim 1, wherein the non-galvanic connection is designed to provide a defined phase shift of the radio-frequency signal transmitted by way of the non-galvanic connection.

18. The semiconductor device as claimed in claim 1, further comprising:
a circuit board, wherein the external radio-frequency terminal is electrically connected to a terminal of the circuit board; and
another non-galvanic connection arranged between the terminal of the circuit board and an internal electrical structure of the circuit board, wherein the other non-galvanic connection is designed to transmit a radio-frequency signal.

19. A method for producing a semiconductor device, wherein the method comprises:
forming a non-galvanic connection between a radio-frequency terminal of a semiconductor chip of the semiconductor device and an external radio-frequency terminal of the semiconductor device, wherein:
the external radio-frequency terminal is designed to connect the semiconductor device electrically and mechanically to a circuit board, and
the non-galvanic connection is designed to transmit a radio-frequency signal.

20. The method as claimed in claim 19, further comprising:
forming a redistribution layer between the radio-frequency terminal of the semiconductor chip and the external radio-frequency terminal, wherein forming the non-galvanic connection is carried out during the forming of the redistribution layer.

* * * * *